(12) United States Patent
Nakanishi et al.

(10) Patent No.: US 7,139,235 B2
(45) Date of Patent: Nov. 21, 2006

(54) OPTICAL ELEMENT WITH DIFFRACTION GRATING, SEMICONDUCTOR DEVICE, AND OPTICAL INFORMATION RECORDING DEVICE EMPLOYING THE SAME

(75) Inventors: Naoki Nakanishi, Kurita-gun (JP); Shoichi Takasuka, Osaka (JP); Shinichi Ijima, Takatsuki (JP); Hideyuki Nakanishi, Otsu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 271 days.

(21) Appl. No.: 10/070,288

(22) PCT Filed: Jul. 4, 2001

(86) PCT No.: PCT/JP01/05822

§ 371 (c)(1),
(2), (4) Date: Feb. 28, 2002

(87) PCT Pub. No.: WO02/03384

PCT Pub. Date: Jan. 10, 2002

(65) Prior Publication Data

US 2002/0163874 A1 Nov. 7, 2002

(30) Foreign Application Priority Data

Jul. 5, 2000 (JP) .............................. 2000-203387

(51) Int. Cl.
*G11B 7/135* (2006.01)
(52) U.S. Cl. ................ 369/112.04; 369/44.41
(58) Field of Classification Search .......... 369/112.04, 369/112.07, 112.12, 44.11, 44.41
See application file for complete search history.

(56) References Cited

U.S. PATENT DOCUMENTS

| | | | | |
|---|---|---|---|---|
| 4,665,310 A | * | 5/1987 | Heemskerk | 369/44.12 |
| 4,894,815 A | * | 1/1990 | Yamanaka | 369/112.04 |
| 4,918,679 A | * | 4/1990 | Opheij et al. | 369/44.23 |
| 5,111,449 A | * | 5/1992 | Kurata et al. | 369/44.37 |
| 5,128,914 A | | 7/1992 | Kurata et al. | |
| 5,144,131 A | | 9/1992 | Opheij et al. | |
| 5,391,865 A | * | 2/1995 | Kurata et al. | 250/201.5 |
| 5,544,143 A | * | 8/1996 | Kay et al. | 369/112.07 |
| 5,608,695 A | * | 3/1997 | Yamazaki | 369/44.12 |
| 5,805,556 A | * | 9/1998 | Lee et al. | 369/112.07 |
| 5,881,043 A | * | 3/1999 | Hasegawa et al. | 369/106 |
| 6,894,958 B1 | * | 5/2005 | Katayama | 369/44.41 |

FOREIGN PATENT DOCUMENTS

| | | |
|---|---|---|
| JP | 2-187936 | 7/1990 |
| JP | 4-232621 | 8/1992 |

(Continued)

*Primary Examiner*—Brian E. Miller
*Assistant Examiner*—Peter Vincent Agustin
(74) *Attorney, Agent, or Firm*—Hamre, Schumann, Mueller & Larson, P.C.

(57) ABSTRACT

An optical semiconductor device comprising an emitted beam branching section (61) which branches an emitted light beam from a laser device (51), a reflected light beam branching section (71) which branches a reflected light beam from an information recording medium (3) into light beams different from each other in focused state, servo signal sensing photodetectors (43, 45) which receive the branched reflected light beam in a defocused state, a first diffraction grating provided in the emitted light beam branching section for diffracting the reflected light beam having passed through the reflected light beam flux branching section, and a signal sensing photodetector (47) which receives the reflected light beam diffracted by the first diffraction grating.

16 Claims, 9 Drawing Sheets

FOREIGN PATENT DOCUMENTS

| | | |
|---|---|---|
| JP | 5-290401 | 11/1993 |
| JP | 8-240718 | 9/1996 |
| JP | 10134395 A * | 5/1998 |
| JP | 11-238234 | 8/1999 |
| JP | 11-339304 | 12/1999 |
| JP | 2000-187872 | 7/2000 |

* cited by examiner

OPTICAL ELEMENT WITH DIFFRACTION GRATING, SEMICONDUCTOR DEVICE, AND OPTICAL INFORMATION RECORDING DEVICE EMPLOYING THE SAME

This Application is a 371 of PCT/JP01/05822 Jul. 4, 2001.

TECHNICAL FIELD

The present invention relates generally to an optical information processing device that performs the recording, reproduction, erasure, etc. of information with respect to an information recording medium such as an optical disk. The present invention particularly relates to an optical semiconductor device employed in an optical head device, which has a function of detecting reproduction signals and various kinds of servo signals, and to an optical element used therein.

BACKGROUND ART

The following description will depict a configuration and principle of operation of a conventional optical semiconductor device used in an optical information processing device, which has a function of detecting reproduction signals and various kinds of servo signals, while referring to FIG. 10. A light beam emitted from a semiconductor laser element 101 as a light source is diffracted in a Y direction as viewed in the figure by a three-beam generating diffraction grating element 102, so that a zeroth order light of the same becomes a main beam while the first order lights (±1) become sub beams. These three beams obtained by division are focused on an information recording medium 106 by an objective lens 105 and reflected by the information recording medium 106, and then enter a hologram element 103.

The hologram element 103 is a diffraction grating composed of gratings, each in a curved line form. A reflected light beam from the information recording medium 106 is divided by the hologram element 103, where the +1-order diffracted light 107A is subjected to a converging effect, while the −1-order diffracted light 107B is subjected to a diverging effect, and they are guided to photodetector elements 104A and 104B, respectively. The +1-order diffracted light 107A incident on the photodetector element 104A is focused before a light-receiving surface thereof, whereas the −1-order diffracted light 107B incident on the photodetector element 104B is focused behind a light-receiving surface thereof.

Reproduction signals and focus error signals are detected from a main beam among the reflected light beams having been guided to the photodetector elements 104A and 104B, while tracking error signals are detected from sub beams among the same. Focus servo is performed so that the +1-order diffracted light 107A and the −1-order diffracted light 107B resulting from the division by the hologram element 103 have light spots of substantially the same size on the photodetector elements. Tracking servo is performed so that sub beams have equal quantities of light. The position of the objective lens is controlled by those servos, whereby an appropriate action of the optical semiconductor device as an optical information processing device can be achieved.

In the foregoing conventional optical semiconductor device, the same photodetector elements 104A and 104B are used for detecting reproduction signals and focus error signals. Since the ±1-order diffracted light having been subjected to the converging and diverging effects, respectively, at the hologram element 103 have to be received in a defocused state by the photodetector elements 104A and 104B, the photodetector elements 104A and 104B must have large light-receiving areas, approximately 30000 μm² each. In the case where the photodetector elements have large light-receiving areas, electric capacitances associated with the photodetector elements increase, thereby impairing the quick responsiveness significantly. This particularly has been a significant problem when CD-ROMs, DVD-ROMs, etc. are reproduced at a high speed, for instance, at several tens of times the normal speed. Furthermore, there has been the following problem as well: in the case where the photodetector element for detecting reproduction signals has a large light-receiving area, stray light components incident thereon (external light, unnecessary reflection) increase, thereby decreasing the signal-to-noise ratio (hereinafter referred to as S/N ratio) of the reproduction signals.

DISCLOSURE OF THE INVENTION

Therefore, with the foregoing in mind, it is an object of the present invention to solve the above-described problems of the prior art, and to provide an optical semiconductor device capable of reproducing an information recording medium at a high speed and obtaining reproduction signals with an excellent S/N ratio, and an optical information processing device employing the same.

An optical semiconductor device of the present invention includes: a laser element; an emitted beam dividing portion for dividing an emitted light beam from the laser element into a plurality of light beams; a reflected beam dividing portion for dividing a reflected light beam from an information recording medium into light beams in different focused states; servo-signal-detecting photodetector elements for receiving the reflected light beams obtained by the division by the reflected beam dividing portion in a defocused state; a first diffraction grating that is provided in the emitted beam dividing portion and that diffracts the reflected light beam having passed through the reflected beam dividing portion; and a signal-detecting photodetector element for receiving reflected light beams having been subjected to the diffraction by the first diffraction grating.

This configuration allows the diffracted light obtained by the diffraction of the reflected light beam from the information recording medium by the first diffraction grating to substantially focus on the reproduction-signal-detecting photodetector element, thereby making it possible to reduce a light receiving area of the reproduction-signal-detecting photodetector element. This allows reduction of the capacitance associated with the photodetector element, thereby ensuring high-speed response of the reproduction signals. Furthermore, the reduction of the area of the reproduction-signal-detecting photodetector element leads to a decrease in stray light components incident on the detecting portion for detecting reproduction signals, thereby allowing reproduction signals with an excellent S/N ratio to be obtained.

An optical semiconductor device of the present invention that has another configuration includes: a laser element; a first optical element through which an emitted light beam from the laser element passes; a second optical element for dividing the reflected light beam from an information recording medium into light beams in different focused states; and a first diffraction grating that is provided in the first optical element and that diffracts the reflected light beam having passed through the second optical element.

An optical element of the present invention includes: a first optical element that is provided on one surface of a transparent member and that includes first and second diffraction gratings; and a second optical element that is provided on the other surface of the transparent member and that divides a reflected light beam into light beams in different focused states, wherein the first and second diffraction gratings are juxtaposed in a first direction, and gratings of the first diffraction grating are arranged in a direction different from the first direction.

DESCRIPTION OF THE INVENTION

First Embodiment

Figure 1:
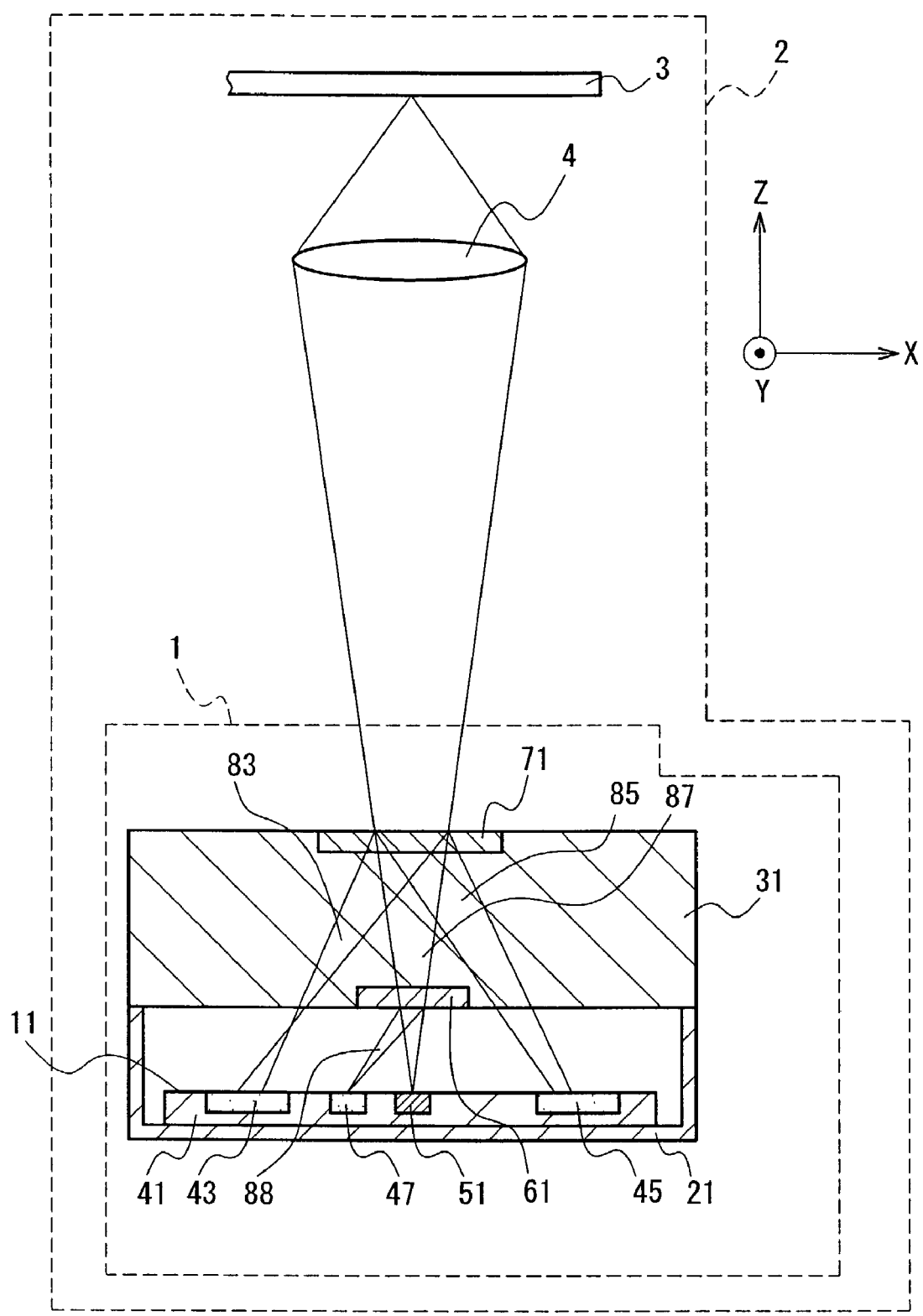
FIG. 1 is a cross-sectional view illustrating a schematic configuration of an optical semiconductor device according to a first embodiment of the present invention and an optical information processing device employing the same.

FIG. 1 schematically illustrates an optical semiconductor device 1 (basic cross-sectional configuration) according to the first embodiment of the present invention, and an optical information processing device 2 in which the optical semiconductor device 1 is employed. The optical information processing device 2 includes an optical semiconductor device 1, an objective lens 4 for focusing a light beam emitted from the optical semiconductor device 1 into an information recording medium 3 (for instance, an optical disk, a magneto-optical disk, etc.), and a mechanism controlling actions of the same (a servo mechanism, a signal processing circuit, etc., though not shown).

The optical semiconductor device 1 includes a semiconductor element 11, a package 21 incorporating the same, and an optical element 31 mounted on the package 21. By sealing the semiconductor element 11 in the package 21 and the optical element 31, the optical semiconductor device 1 has an integrated configuration. Increasing the effectiveness of the sealing improves the reliability of the semiconductor element 11.

The semiconductor element 11 includes a photodetector element 41 having a plurality of detecting portions 43, 45, and 47 that are provided by thermal diffusion or the like on a silicon substrate, and a semiconductor laser element 51 formed on the same silicon substrate. The semiconductor laser element 51 is made of a chemical compound provided at a bottom of a recessed part (not shown) having an inclined surface, formed in the silicon substrate by wet etching. The semiconductor laser element 51 emits a laser beam with a wavelength of approximately 300 to 800 nm. A light beam is emitted in a Y direction from the semiconductor laser element 51, reflected by the inclined surface, so as to be directed in a Z direction. It should be noted that such an inclined surface is unnecessary in the case where the semiconductor laser element 51 is of a plane emission type.

Thus, by integrating the semiconductor laser element 51 and the photodetector element 41 on one silicon substrate, it is possible to obtain a smaller-size optical semiconductor device. Furthermore, in the case where the relative positional relationship between the semiconductor laser element 51 and the photodetector element 41 is determined in the semiconductor process for processing the silicon substrate (for instance, by forming the detecting portions and the recessed part by using mask alignment), it is possible to reduce the number of steps, thereby shortening the time required for assembling and reducing the cost, as compared with a case where these elements are assembled separately and then they are fixed after their positional relationship is adjusted. Furthermore, the detecting portions and the integrated circuit either for current-voltage conversion of electric signals obtained from the detecting portions or for calculation of the same may be provided integrally on a silicon substrate. This makes it possible to further miniaturize the device. It should be noted that the light source is not limited to the semiconductor laser, and a laser of another type (for instance, a laser in which SHG is used) may be used as a light source.

The optical element 31 is composed of a base made of a glass or a resin having substantial transparency with respect to a wavelength used, an emitted beam dividing portion 61 is provided on one of surfaces of the base, for dividing a light beam emitted from the semiconductor laser element 51, and a reflected beam dividing portion 71 is provided on a surface opposite to the foregoing surface, for dividing a light beam reflected from the information recording medium 3. In the emitted beam dividing portion 61, a diffraction grating is provided that, as described later, divides a light beam having passed through the reflected beam dividing portion 71 among the reflected light beam from the information recording medium 3. The emitted beam dividing portion 61 and the reflected beam dividing portion 71 may be provided in the form of separated first and second optical elements. Furthermore, the emitted beam dividing portion 61 may be configured simply to transmit the light beam emitted from the semiconductor laser 51, without having a function to divide the emitted light beam from the semiconductor laser element 51.

A light beam emitted from the semiconductor laser element 51 passes through the emitted beam dividing portion 61 and the reflected beam dividing portion 71, and is focused on the information recording medium 3 by the objective lens 4. A reflected light beam from the information recording medium 3 is divided by diffraction in the X direction by the reflected beam dividing portion 71, and ±1-order diffracted light beams 83 and 85 thus obtained are guided to the detecting portions 43 and 45 of the photodetector element 41. Furthermore, the 0-order diffracted light (transmitted light) again enters the emitted beam dividing portion 61, and is diffracted by a first diffraction grating provided on the emitted beam dividing portion 61, so as to be guided to the detecting portion 47.

Figure 2:
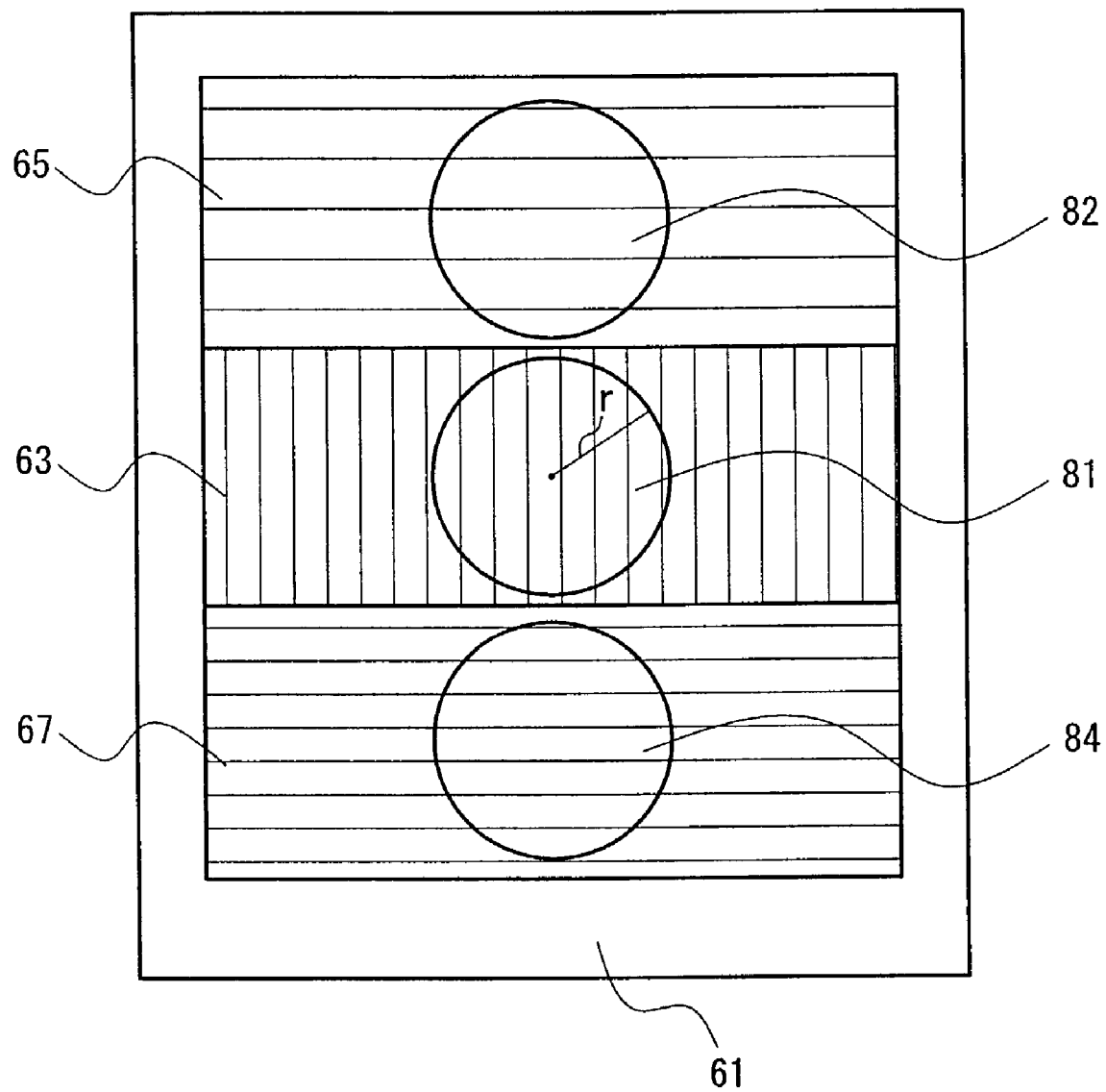
FIG. 2 is a plan view of an emitted beam dividing portion in the optical semiconductor device shown in FIG. 1.

As shown in FIG. 2, the emitted beam dividing portion 61 includes regions serving as a first diffraction grating 63, a second diffraction grating 65, and a third diffraction grating 67, thereby composing a three-beam-generating diffraction grating element. In the drawing, respective patterns of the diffraction gratings are illustrated with a plurality of lines. Furthermore, effective regions on the emitted beam dividing portion 61 corresponding to the beams to be collected into the objective lens 4 are indicated as a main beam 81 (r representing a radius of the same), and sub beams 82 and 84.

The emitted light beam from the semiconductor laser element 51 is diffracted by the emitted beam dividing portion 61 in a Y direction shown in the drawing. As a result of division, a 0-order diffracted light obtained from the first diffraction grating is obtained as the main beam 81, while ±1-order diffracted lights obtained from the second and third diffraction gratings 65 and 67 are obtained as the sub beams 82 and 84, respectively, thereby being collected into the objective lens 4 as a focusing means.

On an optical axis extending between an emission point of the semiconductor laser element 51 and a main beam spot incident on the information recording medium 3, let an air-equivalent distance from the emission point of the semiconductor laser element 51 to the emitted beam dividing portion 61 be represented by d. Here, the air-equivalent distance means a value obtained by dividing a distance of light transmission through a medium by a refractive index of the medium. Further, let a numerical aperture of the objective lens 4 be represented by NA. Furthermore, let a distance in an X direction measured from a point at which the optical axis and the emitted beam dividing portion 61 cross on the emitted beam dividing portion 61 be represented by r. Here, the first diffraction grating 63 is formed so as to have an area that includes at least an area satisfying:

$$r \leq d \times \tan(\sin^{-1}(NA)) \quad \text{[Formula 1]}$$

The reflected light dividing portion 71 is made of a hologram element composed of gratings, each in a curved line form. Among the three beams reflected from the information recording medium 3, as to each of the main beam 81 and sub beams 82 and 84, the +1-order diffracted light beam 83 is subjected to a converging effect while the −1-order diffracted light beam 85 is subjected to a diverging effect when they are divided, and they are guided to the detecting portions 43 and 45 of the photodetector element 41. On the other hand, the 0-order diffracted light beam 87 of the main beam 81 of the reflected light beam, obtained by the division by the reflected beam dividing portion 71, again enters the emitted beam dividing portion 61. This light beam is diffracted in the X direction by the first diffraction grating 63 of the emitted beam dividing portion 61. The first diffraction grating 63 and the like are configured so that the +1-order diffracted light beam 88 at the first diffracted grating 63 assumes a substantially focused state at the reproduction-signal-detecting detecting portion 47 provided on the photodetector element 41. This makes it possible to decrease the light-receiving area of the reproduction-signal-detecting detecting portion 47, thereby allowing reproduction signals to be detected at a higher speed. In examples, it was possible to set the light-receiving area of the reproduction-signal-detecting detecting portion 47 to be approximately 400 to 2500 µm².

Figure 3:
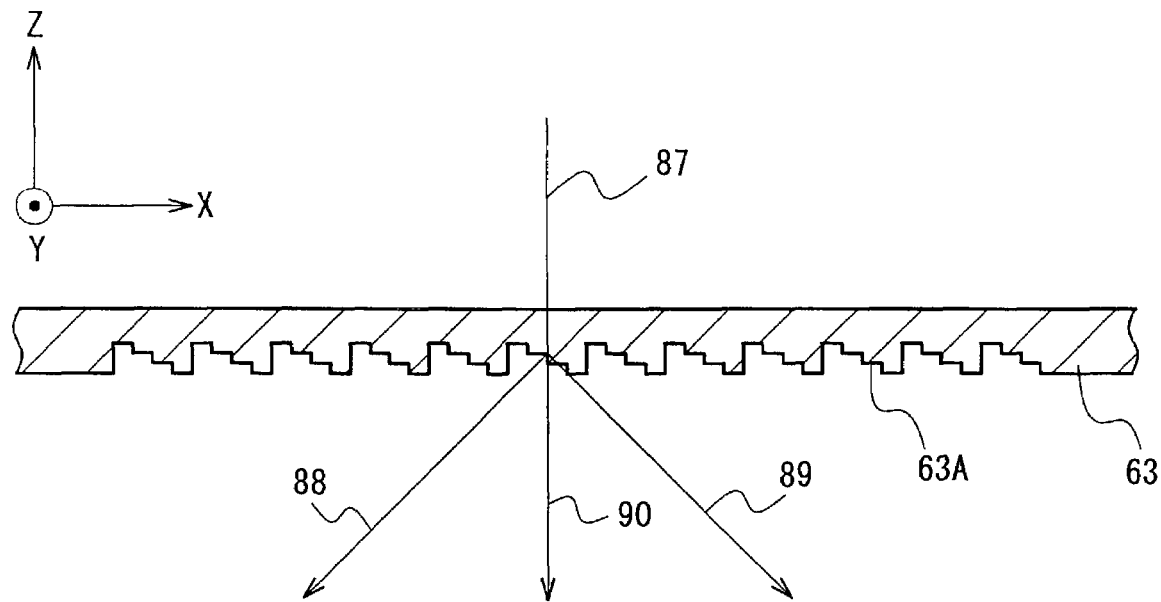
FIG. 3 is an enlarged cross-sectional view specifically illustrating a first diffraction grating in the emitted beam dividing portion shown in FIG. 2.

FIG. 3 is an enlarged cross-sectional view specifically illustrating the first diffraction grating 63 in the emitted beam dividing portion 61. In each diffraction grating in the first diffraction grating 63, gratings 63A in a step-like form are provided further. This configuration makes it possible to increase the diffraction efficiency of the +1-order diffracted light beam 88 incident on the reproduction-signal-detecting detecting portion 47 with priority to the diffraction efficiency of the −1-order diffracted light beam 89. Therefore, the quantity of the signal light incident on the reproduction-signal-detecting detecting portion 47 increases, thereby allowing reproduction signals with an excellent S/N ratio to be obtained. The step-like grating 63A can be formed by, for instance, carrying out photolithography and etching a plurality of times.

Figure 4:
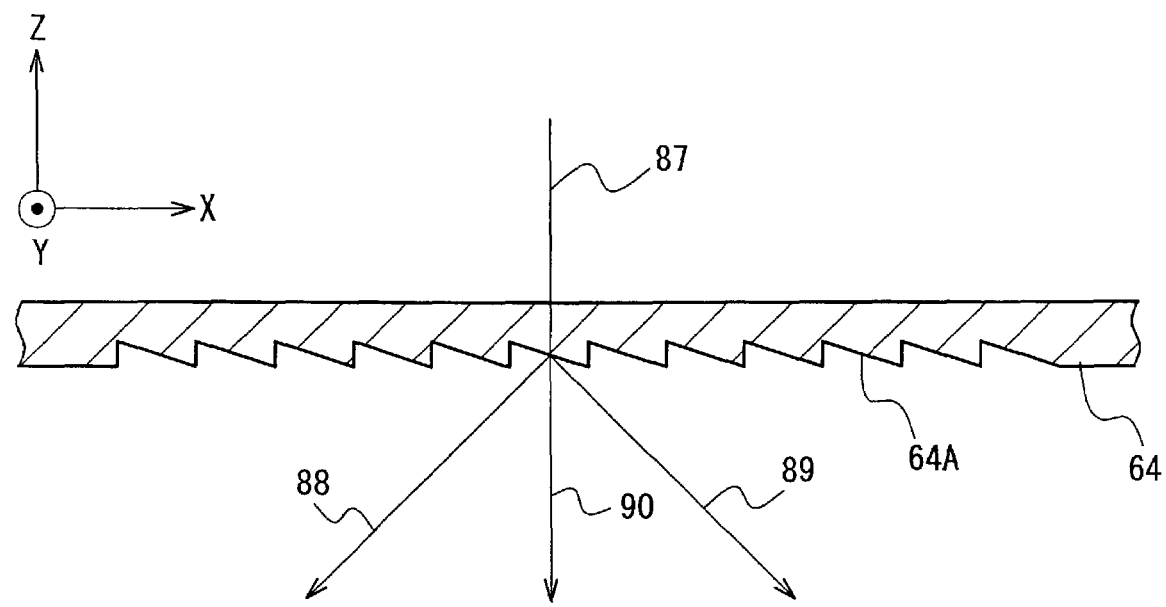
FIG. 4 is an enlarged cross-sectional view specifically illustrating another embodiment of the first diffraction grating.

FIG. 4 is an enlarged cross-sectional view specifically illustrating another configuration of the first diffraction grating 64. Gratings 64A, each having a triangular cross section, are provided as diffraction gratings composing the first diffraction grating 64. It is possible to directly form the triangular gratings 64A with an electron beam (EB) whose intensity can be varied stepwise, or alternatively, it is possible to form the same by exposing and developing a photosensitive material and using the obtained photosensitive material as a die. This configuration also makes it possible to increase the diffraction efficiency of the +1-order diffracted light beam 88 incident on the reproduction-signal-detecting detecting portion 47 with priority to the −1-order diffracted light beam 89, thereby allowing reproduction signals with an excellent S/N ratio to be obtained.

The first diffraction grating 63 may be composed of substantially rectangular diffraction gratings.

Figure 5:
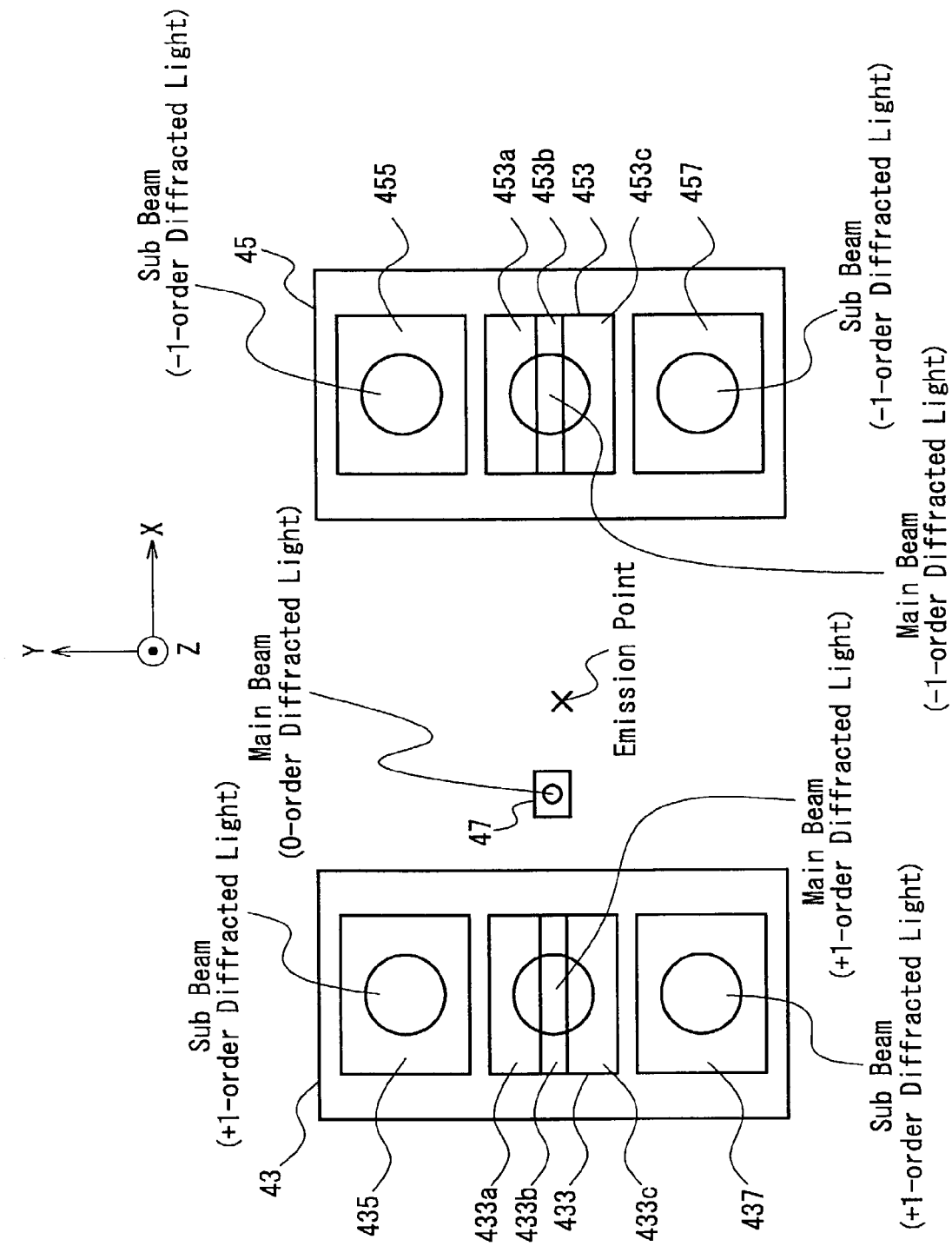
FIG. 5 is an enlarged plan view specifically illustrating an arrangement of detecting sections included in the photodetector element in the optical semiconductor device shown in FIG. 1

FIG. 5 is an enlarged plan view specifically illustrating the detecting portions 43 and 45 and the reproduction-signal-detecting detecting portion 47 of the optical element 41. The detecting portion 43 includes three detecting sections 433, 435, and 437 extending in an X direction. The detecting section 433 is divided into three portions 433a, 433b, and 433c in a Y direction. The detecting portion 45, like the detecting portion 43, includes the detecting sections 453, 455, and 457. The detecting section 453 is divided into three portions 453a, 453b, and 453c in the Y direction. Focus error signals are detected from a main beam 81 among the reflected light beams having been guided to the detecting portions 43 and 45, while tracking error signals are detected from sub beams 82 and 84 among the same. Spots formed on the detecting sections are shown schematically in FIG. 5.

Here, let signal quantities detected at the detecting sections 433a, 433b, 433c, 435, 437, 453a, 453b, 453c, 455, and 457 be expressed as S(433a), S(433b), S(433c), S(435), S(437), S(453a), S(453b), S(453c), S(455), and S(457), respectively.

The focus servo is performed so that the spot on the detecting portion for the main beam has substantially the same size, that is, the following is satisfied:

$$\{S(433a)+S(433c)+S(453b)\}-\{S(433b)+S(453a)+S(453c)\}=0$$

The tracking servo is performed so that the sub beams have equal light quantities, that is, the following is satisfied:

$$\{S(435)+S(455)\}-\{S(437)+S(457)\}=0$$

As described above, the 0-order diffracted light beam 87 from the reflected beam dividing portion 71 is incident on the first diffraction grating 63 of the emitted beam dividing portion 61, and the +1-order diffracted light beam 88 obtained therefrom is incident in a substantially focused state on the reproduction-signal-detecting detecting portion 47. A spot formed by the +1-order diffracted light beam 88 on the reproduction-signal-detecting detecting portion 47 is shown schematically in FIG. 5. Since the +1-order diffracted light beam 88 is incident thereon in the substantially focused state, the reproduction-signal-detecting detecting portion 47 may have a reduced area for receiving light, as compared with the other detecting sections 433, 435, and 437 for servo. The reduction of the light-receiving area of the reproduction-signal-detecting detecting portion 47 allows the capacitance associated with the photodetector element to be remarkably reduced, thereby ensuring high-speed response of the reproduction signals. Furthermore, this leads to a decrease in stray light components incident on the reproduction-signal-detecting detecting portion 47, thereby allowing reproduction signals with an excellent S/N ratio to be obtained.

Second Embodiment

Figure 6:
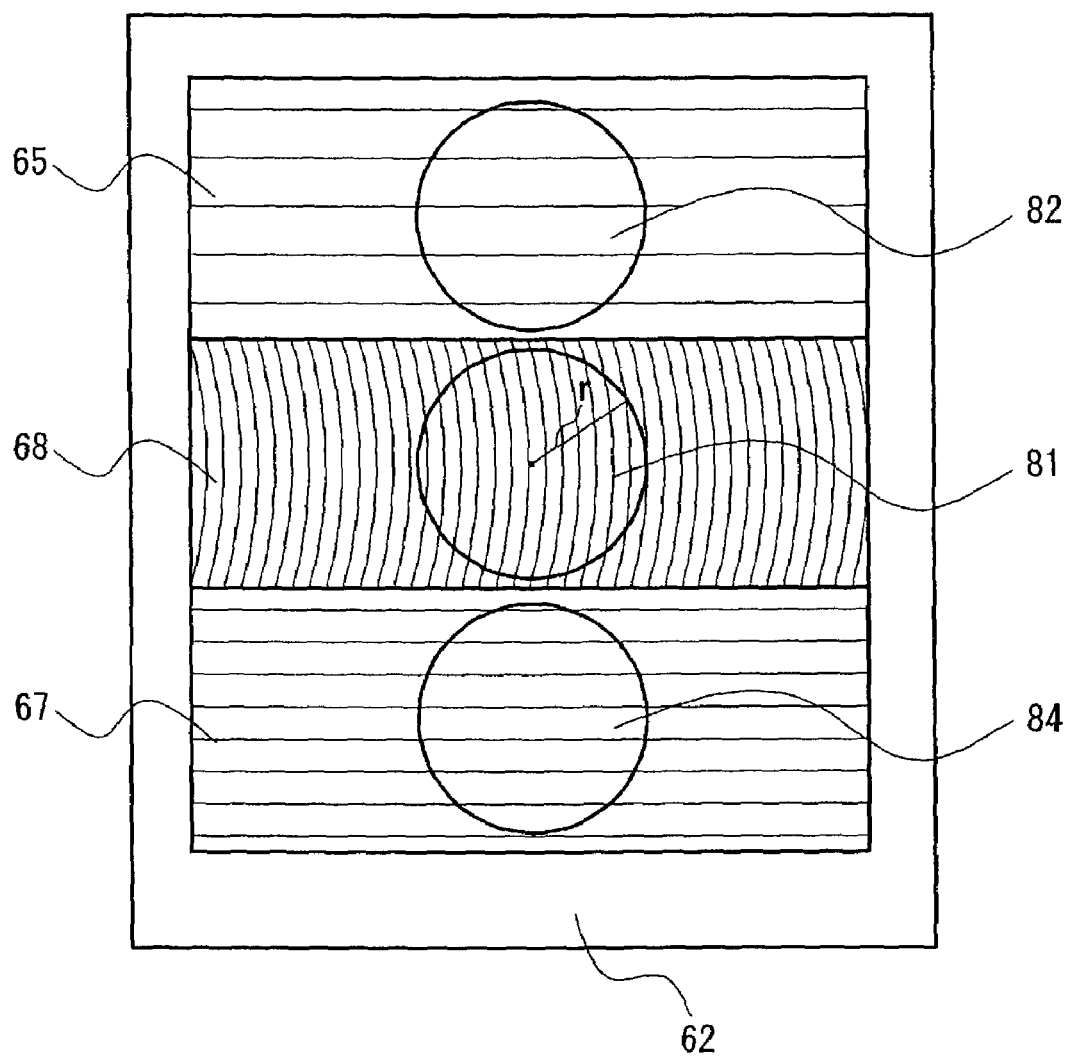
FIG. 6 is a plan view illustrating an emitted beam dividing portion in an optical semiconductor device according to a second embodiment of the present invention.

FIG. 6 is a plan view illustrating an emitted beam dividing portion 62 according to the second embodiment. The present embodiment is an example of another embodiment of the emitted beam dividing portion 61 used in the first embodiment.

The emitted beam dividing portion 62 is characterized in that a first diffraction grating 68 is composed of gratings, each in a curved line form. The other parts of the configuration are the same as those of the emitted beam dividing portion 61, and the same elements are designated with the same reference numerals. The configuration with gratings in the curved line form is able to apply a converging or diverging effect to light beams when being diffracted by the first diffraction grating 68. Therefore, it is possible to change freely a position of a focus of the reflected light beam from the information recording medium 3 by varying the curvature of the grating lines. This makes it possible to make the reflected light beam from the information recording medium 3 in a substantially focused state on the reproduction-signal-detecting detecting portion 47, irrespective of the distance between the surface of the photodetector element and the emitted beam dividing portion 62.

The same effect as that of the first embodiment can be achieved by providing step-like gratings similar to those in the first embodiment in each grating of the first diffraction grating 68.

Third Embodiment

Figure 7:
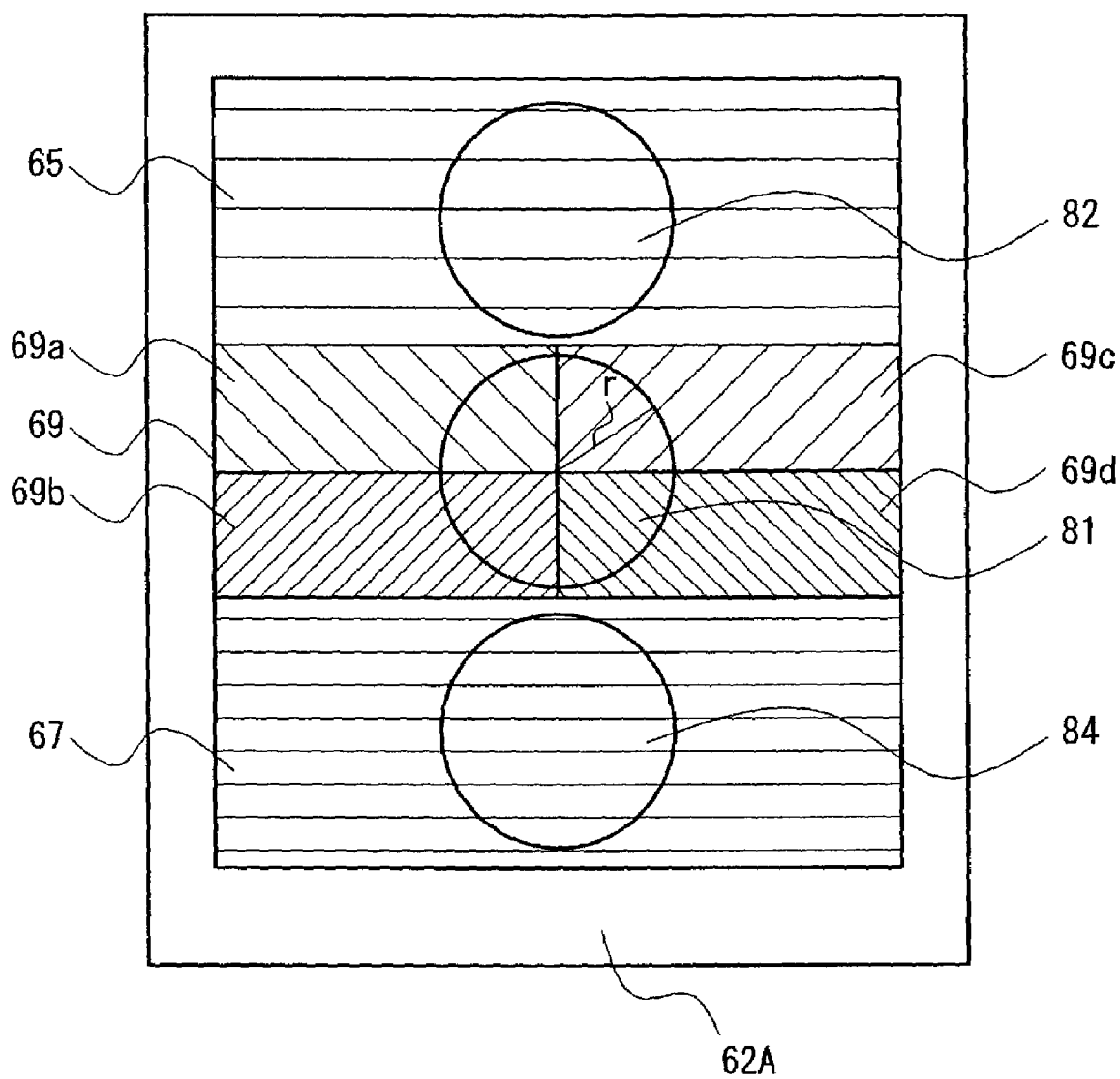
FIG. 7 is a plan view illustrating an emitted beam dividing portion in an optical semiconductor device according to a third embodiment of the present invention.
Figure 8:
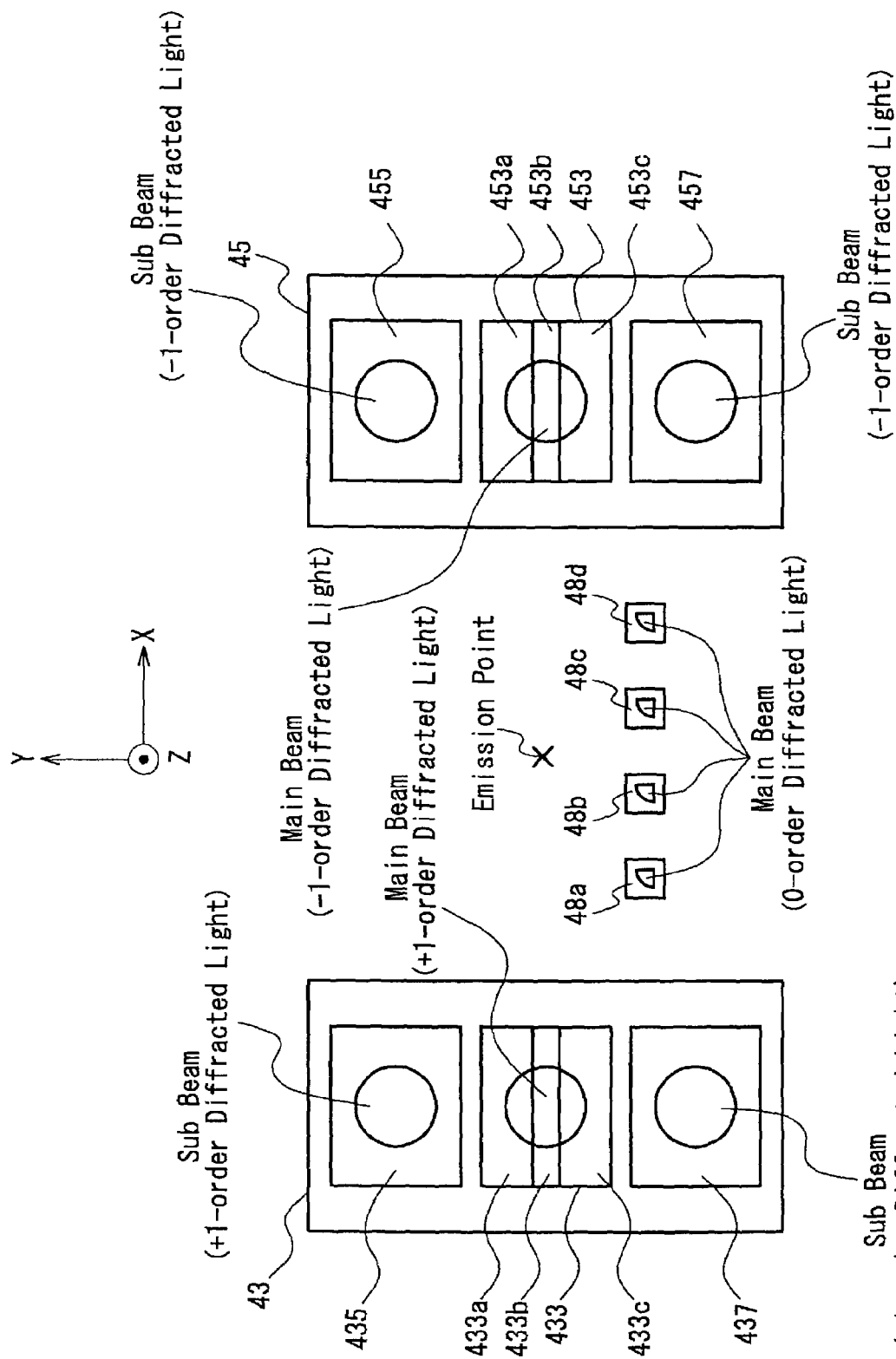
FIG. 8 is an enlarged plan view specifically illustrating an arrangement of detecting sections included in a photodetector element in the optical semiconductor device according to the third embodiment of the present invention.

The third embodiment is an example in which the emitted beam dividing portion 61 in the first embodiment is modified so as to have still another configuration. FIG. 7 is a plan view illustrating an emitted beam dividing portion 62A according to the present embodiment. FIG. 8 is an enlarged plan view specifically illustrating the photodetector element. Elements other than a first diffraction grating 69 and detecting portions 48a, 48b, 48c, and 48d for detecting reproduction signals have the same configurations as those of the first embodiment, and they are designated with the same reference numerals.

In the emitted beam dividing portion 62A according to the present embodiment, the first diffraction grating 69 is composed of a plurality of diffraction grating regions with grating arrangement directions different from each other. In the first diffraction grating 69 shown in FIG. 7, four diffraction grating regions 69a, 69b, 69c, and 69d with the grating arrangement directions different from each other are provided so as to equally divide a spot of a reflected light beam from the information recording medium 3.

As shown in FIG. 8, a plurality of the detecting portions 48a, 48b, 48c, and 48d are provided to receive light beams diffracted by the diffraction grating regions 69a, 69b, 69c, and 69d. They are arranged so that light beams diffracted by the diffraction grating regions 69a, 69b, 69c, and 69d substantially focus on the detecting portions 48a, 48b, 48c, and 48d for detecting reproduction signals, respectively.

With this configuration, the reflected light beam of the main beam 81 from the information recording medium 3 is diffracted by the plurality of diffraction grating regions 69a, 69b, 69c, and 69d composing the first diffraction grating 69, and is incident on the detecting portions 48a, 48b, 48c, and 48d for detecting reproduction signals, respectively. Thus, the use of signals detected by the plurality of detecting portions 48a, 48b, 48c, and 48d corresponding to the respective spots makes it possible to obtain a push-pull signal or a phase difference signal. Therefore, this makes it possible to subject the tracking error signal to an optimal method selected from among the three-beam method, the push-pull method, and the phase difference method according to the type of the information recording medium 3 used.

Figure 9:
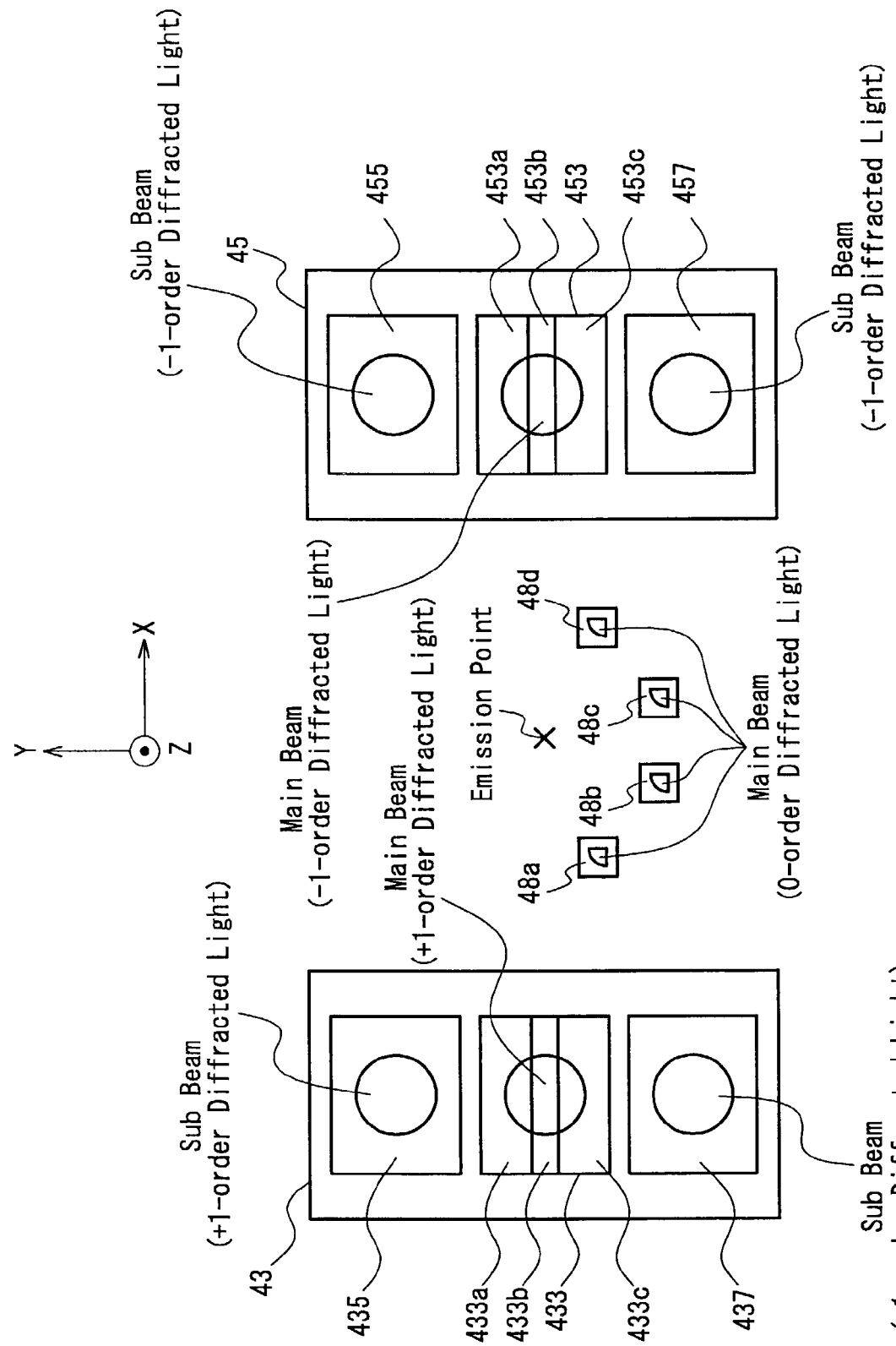
FIG. 9 is an enlarged plane view specifically illustrating another embodiment of an optical element in the optical semiconductor device according to the third embodiment of the present invention.
Figure 10:
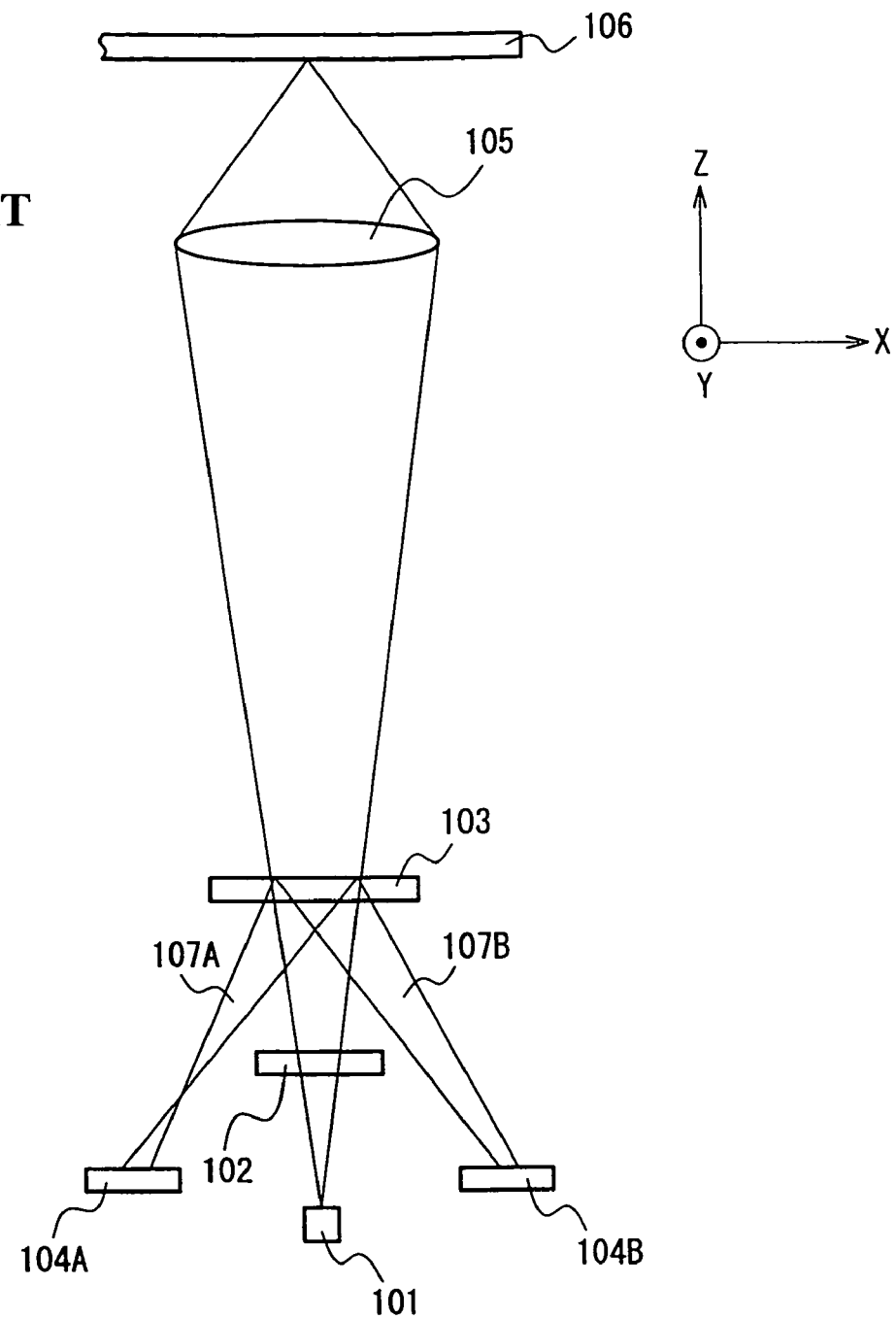
FIG. 10 is a cross-sectional view illustrating a conventional optical semiconductor device and an optical information processing device employing the same.

Furthermore, as shown in FIG. 9, which is an enlarged plan view specifically illustrating the photodetector element, the detecting portions 48a, 48b, 48c, and 48d for detecting reproduction signals may be arranged at equal distances from the emission point. This configuration allows the first diffraction grating 69 to have the same grating periodic interval at all the plurality of diffraction grating regions 69a, 69b, 69c, and 69d composing the first diffraction grating 69. Therefore, when the first diffraction grating is formed by etching or the like, variation in manufacture, such as variation of depth of the gratings, is minimized. Consequently, it is possible to manufacture the same with stable properties.

It should be noted that in the optical information processing device of FIG. 1, the objective lens 4 may be fixed in the optical semiconductor device 1 so as to be actuated integrally. This by no means leads to the impairment of optical characteristics, such as a decrease in the signal quantity, that tends to occur when the objective lens is actuated independently. Therefore, it is possible to obtain excellent reproduction signals and focus/tracking error signals.

The optical semiconductor device according to the present invention can be defined in a broader sense. For instance, a so-called optical pickup device in which the optical semiconductor device 1, the objective lens 4, and a part of the control mechanisms are modularized also is categorized as the optical semiconductor device of the present invention. On the other hand, in the case where the semiconductor element 11 is dealt with independently, it is called a semiconductor laser device or a light-receiving device, which also is categorized in a broad sense as the optical semiconductor device of the present invention.

Furthermore, although the above-described embodiments show an example in which an area of the detecting portions for detecting reproduction signals is reduced, this invention is also applicable to a detecting portion that is required to perform high-speed processing for a different reason.

INDUSTRIAL APPLICABILITY

With the present invention, it is possible to reduce an area of a reproduction-signal-detecting photodetector element in an optical semiconductor device. This makes it possible to provide an optical information processing device that is capable of performing high-speed reproduction and obtaining reproduction signals with an excellent S/N ratio.

The invention claimed is:

1. An optical semiconductor device comprising:
   a laser element;
   an emitted beam dividing portion for dividing an emitted light beam from the laser element into a main beam and two sub beams;
   a reflected beam dividing portion for dividing a reflected light beam from an information recording medium into light beams in different focused states, the reflected light beam being divided in a direction lateral to the direction in which the emitted beam is divided with the emitted beam dividing portion;
   servo-signal-detecting photodetector elements for receiving the reflected light beams obtained by the division by the reflected beam dividing portion in a defocused state so as to detect a servo signal using a three-beam method; and
   a signal-detecting photodetector element for receiving a reflected light beam obtained by diffracting with the emitted beam dividing portion a reflected light beam that has passed through the reflected beam dividing portion,
   wherein the emitted beam dividing portion includes a first diffraction grating region for generating the main beam, and second and third diffraction grating regions for generating the sub beams, and
   the signal-detecting photodetector element receives a beam that is obtained by diffracting the reflected light beam of the main beam with the reflected beam dividing portion and then diffracting an obtained zero order diffracted beam with the first diffraction grating region.

2. The optical semiconductor device according to claim 1, wherein the first diffraction grating region is positioned between the second and third diffraction grating regions, and the second and third diffraction grating regions have the same grating arrangement direction which is different from a grating arrangement direction of the first diffraction grating region.

3. The optical semiconductor device according to claim 1, wherein two diffracted light beams of the same order diffraction by the first diffraction grating region are subjected to the diffraction with different diffraction efficiencies, and the diffracted light beam having the higher diffraction efficiency is received by the signal-detecting photodetector element.

4. The optical semiconductor device according to claim 3, wherein each grating in the first diffraction grating region is of an inclined type having a step-like cross-section shape or a triangular cross-sectional shape.

5. The optical semiconductor device according to claim 1, wherein the first diffraction grating region is composed of gratings, each of which is in a curved line form.

6. The optical semiconductor device according to claim 1, wherein the first diffraction grating region is composed of a plurality of diffraction grating regions having the same diffraction efficiency.

7. The optical semiconductor device according to claim 1, wherein the first diffraction grating region is composed of at least two diffraction grating regions that differ from each other in a direction in which gratings are arranged.

8. The optical semiconductor device according to claim 1, wherein the first diffraction grating region is composed of diffraction grating regions having the same grating periodic interval.

9. The optical semiconductor device according to claim 1, wherein the first diffraction grating region is composed of a plurality of diffraction grating regions that divide a spot of the reflected light beam equally.

10. The optical semiconductor device according to claim 1, wherein:
   when the emitted beam dividing portion is positioned on an optical axis extending between an emission point of the laser element and a main spot formed via an objective lens on the information recording medium, the reflected light beam from the foregoing information recording medium entering a region defined by a radius r satisfying a formula shown below is divided so as to be collected on the signal-detecting photodetector element:

$$r \leq d \times \tan(\sin^{-1}(NA))$$

where:
   d represents an air-equivalent distance from the emission point of the laser element to the emitted beam dividing portion;
   NA represents a numerical aperture of the objective lens; and
   r represents a distance from a center located at a point at which the optical axis and the emitted beam dividing portion cross each other on the emitted beam dividing portion.

11. The optical semiconductor device according to claim 1, wherein the signal-detecting photodetector element has a light-receiving area smaller than a light-receiving area of the servo-signal-detecting photodetector elements.

12. The optical semiconductor device according to claim 1, wherein:
   a pair of the servo-signal-detecting photogetector elements are arranged symmetrically with respect to an optical axis; and
   the signal-detecting photodetector element is arranged at a shorter distance from the optical axis than the servo-signal-detecting photodetector elements and has a light-receiving area smaller than a light-receiving area of the servo-signal-detecting photodetector elements,
   wherein the pair of the servo-signal-detecting photodetector elements and the signal-detecting photodetector element are integrated.

13. The optical semiconductor device according to claim 12, wherein the signal-detecting photodetector element is positioned closer to one of the servo-signal-detecting photodetector elements.

14. The optical semiconductor device according to claim 12, wherein the signal-detecting photodetector element is provided in substantially a same plane as an emission point of the laser element.

15. The optical semiconductor device according to claim 12, wherein the signal-detecting photodetector element is divided into a plurality of detecting sections having substantially equal areas.

16. An optical information processing device comprising:
   a laser element;
   an emitted beam dividing portion for dividing an emitted light beam from the laser element into a main beam and two sub beams;
   an optical system for guiding the light beams obtained by the division by the emitted beam dividing portion to an information recording medium;
   a reflected beam dividing portion for dividing a reflected light beam from the information recording medium into light beams in different focused states, the reflected light beam being divided in a direction lateral to the direction in which the emitted beam is divided with the emitted beam dividing portion;

servo-signal-detecting photodetector elements for receiving the light beams obtained by the division by the reflected beam dividing portion in a defocused state so as to detect a servo signal using three-beam method; and a signal-detecting photodetector element for receiving a light beam obtained by diffracting with the emitted beam dividing portion the reflected light beam that has passed through the reflected beam dividing portion, wherein the emitted beam dividing portion includes a first diffraction grating region for generating the main beam, and second and third diffraction grating regions for generating the sub beams, and the signal-detecting photodetector element receives a beam that is obtained by diffracting the reflected light beam of the main beam with the reflected beam dividing portion and then diffracting an obtained zero order diffracted beam with the first diffraction grating region.

* * * * *